Inventor
Mervin B. Arisman
By Ira Milton Jones
Attorney

Oct. 2, 1956

M. B. ARISMAN 2,765,384

COMBINED VARIABLE RESISTOR AND SWITCH FOR USE WITH PRINTED CIRCUITS

Filed Jan. 11, 1954

2 Sheets-Sheet 2

Inventor
Mervin B. Arisman
By Ira Milton Jones
Attorney

United States Patent Office 2,765,384

Patented Oct. 2, 1956

2,765,384

COMBINED VARIABLE RESISTOR AND SWITCH FOR USE WITH PRINTED CIRCUITS

Mervin B. Arisman, Elkhart, Ind., assignor to Chicago Telephone Supply Corporation, Elkhart, Ind., a corporation of Indiana Application January 11, 1954, Serial No. 403,401

6 Claims. (Cl. 201—55)

This invention relates to a combined variable resistor and electric switch of the type widely used in radio and television receivers, and has as its general purpose to provide a control of this type especially adapted for use with printed circuitry.

With printed circuitry the wiring by which the various circuit components are connected is printed upon a panel of suitable insulating material. This technique has many advantages but the adaptation of the circuit components thereto has presented some rather serious problems, especially to the manufacturer of controls of the type with which this invention deals. The connection of a circuit component into such a printed circuit is best accomplished if the terminals of the component are arranged to protrude through holes in the printed circuit panel to be contiguous to their respective leads or wiring printed upon the panels; but the combined variable resistors and switches which were designed to be used in the conventional manner were not adapted to such assembly with printed circuit panels. This, of course, necessitated some change in these circuit components.

On the other hand, the basic designs which years of experience have shown to be sound for such circuit components as combined variable resistors and switches, should not be disturbed. Accordingly it is a specific object of this invention to provide a simple and inexpensive manner of mounting and arranging the terminals of a combined resistor and switch to adapt the same to use with printed circuit panels without entailing changes in the general overall design of the combined control.

Another object of this invention is to provide a combined resistor and switch of the character described wherein the arrangement of the terminals is such that switches of the double pole, single throw type as well as single pole, single throw switches are readily accommodated, despite the fact that the number of terminals is doubled.

Another object of this invention is to provide a combined variable resistor and switch with novel means for firmly holding its terminals, and especially the switch terminals, in position to project through a printed circuit panel and also locate the entire unit in proper spaced relation on the printed circuit panel.

With the above and other objects in view, which will appear as the description proceeds, this invention resides in the novel construction, combination and arrangement of parts substantially as hereinafter described and more particularly defined by the appended claims, it being understood that such changes in the precise embodiment of the hereindisclosed invention may be made as come within the scope of the claims.

The accompanying drawings illustrate two complete examples of the physical embodiments of the invention constructed according to the best modes so far devised for the practical application of the principles thereof, and in which.

Figure 1:
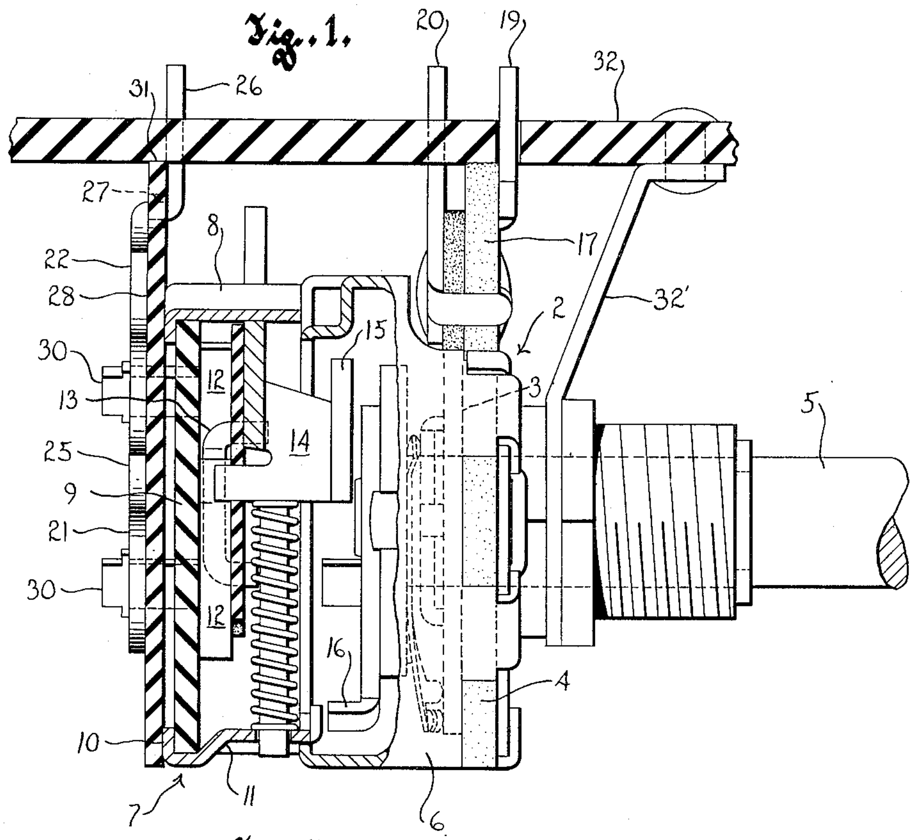
Figure 1 is a view partially in side elevation and partially in longitudinal section illustrating a combined variable resistor and electric switch incorporating one adaptation of this invention.

Referring now particularly to the accompanying drawings, the numeral 2 designates generally a variable resistor of the more or less conventional type having a resistance element 3 mounted upon the inner face of an insulating base 4 to be traversed by a contactor driven by a control shaft 5. The base 4 coacts with a cup-shaped metal casing 6 to provide a housing for the instrumentalities of the variable resistor and as is customary the control shaft 5 passes through the base 4 which normally is considered the front wall of the control.

Mounted in tandem relationship to the variable resistor and preferably secured to the back wall of its housing is an electric switch indicated generally by the numeral 7. The instrumentalities of this switch are enclosed within a housing comprising a substantially cylindrical stamped metal shell 8 and an end wall 9 of insulating material secured to the shell by being confined between an inturned flange 10 and indentations 11 in the side wall of the shell. The end wall 9 provides the base for the switch, and in that embodiment of the invention illustrated in Figures 1, 2 and 3, where the switch is of the double pole, single throw type, there are four fixed contacts 12 mounted on the base and projecting from the inner face thereof to coact with bridging contactors 13. Since the switch illustrated is of the type forming the subject matter of Patent No. 2,660,634, issued November 24, 1953, the movable contact mechanism moves with a rectilinear motion and is driven by a pitman-like actuator 14 provided with a cam 15 disposed within the housing of the variable resistor to be engaged by a switch actuating lug 16 which forms part of the rotating assembly driven by the control shaft 5.

As is customary, the base 4 of the variable resistor has a radially outwardly projecting segment 17 to provide a terminal support and to which the terminals 18, 19 and 20 of the variable resistor are secured. The terminals 18 and 20 are electrically connected to the ends of the resistance element and the terminal 19 is connected to the collector ring which like the resistance element is also traversed by a contact finger driven by the control shaft 5. The outer end portions of these terminals project straight out from the terminal support 17 so that they occupy planes parallel to the base 4 and consequently normal to the axis of the control shaft.

Figures 3, 4, 5:
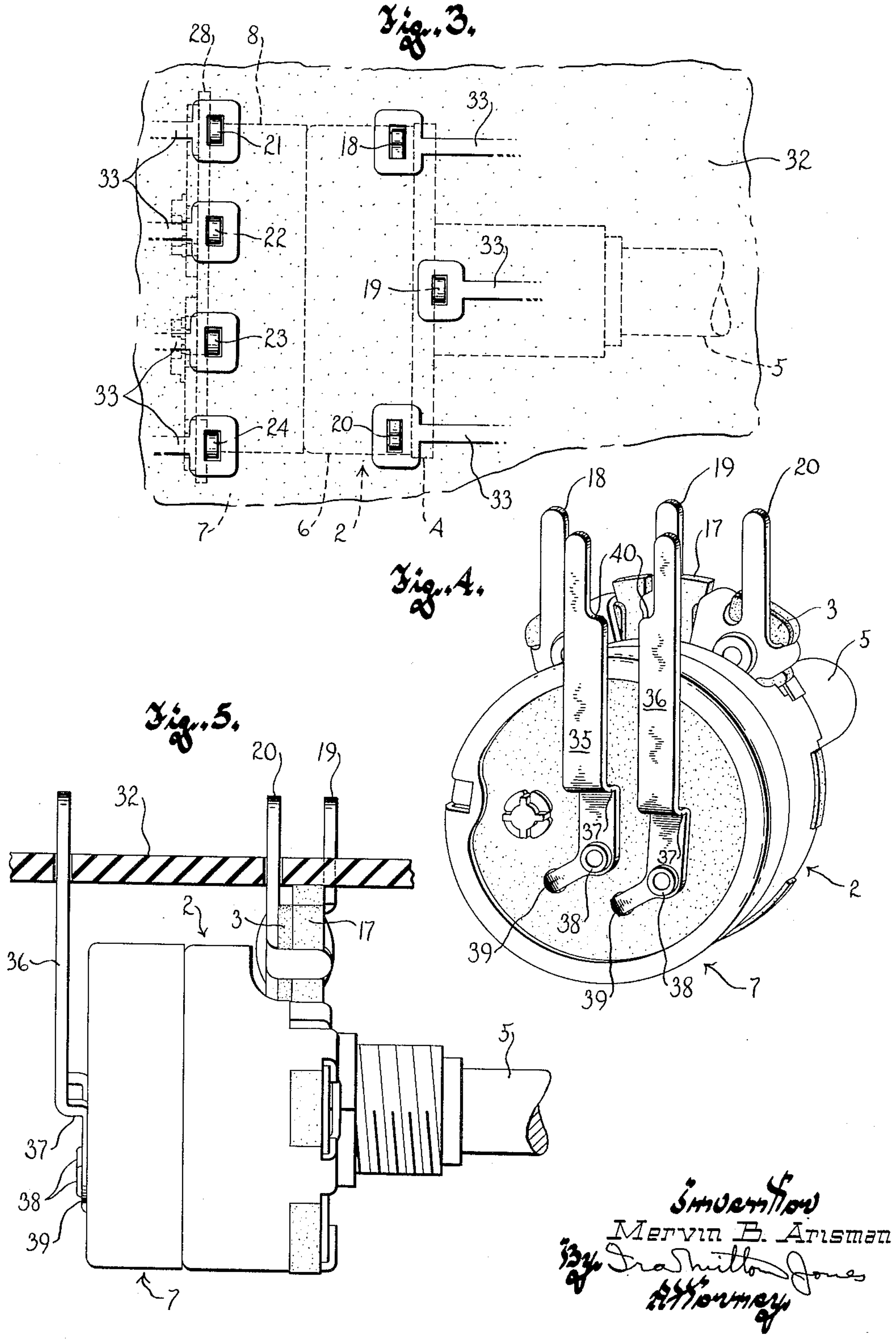
Figure 3 is a top view of a portion of a printed wiring panel with the combined variable resistor and switch of Figures 1 and 2 shown in dotted lines therebeneath and with its terminals in position to be soldered to their respective leads.
Figure 4 is a perspective view of a combined variable resistor and electric switch of the single pole, single throw type illustrating a modified adaptation of this invention.
Figure 5 is a side elevational view of the control shown in Figure 4, illustrating the same assembled with a printed circuit panel.

While the outer end portions of the terminals 18 and 20 are shown disposed at an angle to one another and substantially radial to the axis of the control shaft, these terminals may be shaped to dispose their outer end portions in parallel relationship to each other and to the center terminal 19 as shown for instance in the modified embodiment of the invention illustrated in Figure 4. In any event, the outer end portions of all of these terminals are long enough to project a substantial distance beyond the edge of the terminal support 17 and preferably their extremities lie in a plane parallel to the axis of the control shaft and normal to the longitudinal axis of the center terminal 19.

Each stationary contact of the switch, of course, has its own terminal. Hence, in the double pole, single throw switch of Figures 1, 2 and 3 there are four switch terminals 21, 22, 23 and 24. All of these contacts are stamped from sheet metal and have a flat body portion 25 and a narrower outer end portion 26 integrally joined to one another in offset relation by an intermediate step portion 27. The extent of the offset is equal to the thickness of a plate 28 of insulating material to which the switch terminals are connected with their body portions overlying one side of the plate and their end portions overlying the other side thereof, by having the narrow end portions of the terminals passed through holes 29 in the plate and their step portions 27 received in these holes.

Figure 2:
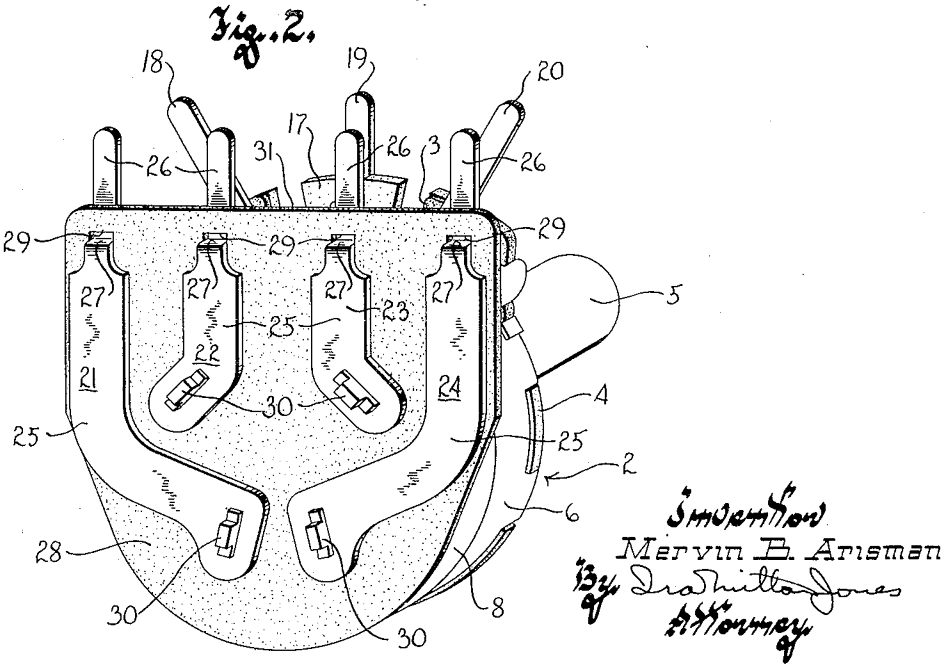
Figure 2 is a perspective view of the combined control shown in Figure 1.

The plate 28 is of a size and shape to cover the entire back end of the switch and more especially the flange 10 of its metal shell, where it is held by the connections between the stationary contacts of the switch and their respective terminals. Thus each contact has an anchoring stem 30 which projects laterally therefrom through the switch base 9, the plate 28 and the body portion 25 of its respective terminal, and is swaged over the latter to clamp the parts together and electrically connect the terminal and contact. As shown in Figure 2 the terminals are shaped to have their body portions overlie their respective contacts while their outer end portions (which constitute the terminals per se) are all parallel to one another and all of their step portions 27 are in line and equispaced from the adjacent straight edge 31 of the plate 28.

It is to be noted that the insulating plate 28, which may be considered a terminal board, being interposed between the flange 10 and the terminals effectively insulates the terminals from the shell 8, and also that the plate is so positioned on the control that its straight edge 31 lies in a plane parallel to but inwardly of the plane which contains the extremities of the variable resistor terminals 18, 19 and 20. Hence when the control is assembled with a printed circuit panel 32 with the control shaft 5 substantially parallel with the panel or more broadly at one side of the panel, and with the edge 31 of the plate 28 and the edge of the terminal support 17 resting on the panel as shown in Figure 1, all of the terminals of the control, i. e. of the variable resistor as well as the switch, protrude through holes in the panel to be contiguous to their respective leads 33 printed upon the opposite face of the panel. This enables the leads to be easily soldered to the terminals by any of the various methods developed by the different radio and television receiver manufacturers in their adaptation of printed circuitry.

Since the locating edge 31 and the outer edge of the terminal support 17 coact to locate the control on the panel with the control shaft properly spaced and oriented the soldering of the terminals to their respective leads may be depended upon to fasten the control to the panel; but where greater rigidity and strength are required a bracket 32′ may be provided. This bracket is clamped to the conventional threaded bushing in which the shaft is journalled and is then fastened to the panel as shown in Figure 1. It will be seen therefore that the bracket 32′ and the terminal support 17 coact to provide mounting means for the control located at the front thereof for not only securely attaching the control to the panel but also holding it properly spaced from the panel; and that the engagement of the locating surface provided by the edge 31 of the plate 28 with the panel supports the control at its rear and hence coacts with the mounting means 17—32′ to assure exceptional stability for the control and proper orientation of its control shaft with respect to the panel.

In that form of the invention illustrated in Figures 4 and 5 where the switch is of the single pole, single throw type the insulated plate 28 is omitted and instead the switch terminals 35 and 36 are offset as at 37 so as to space their outer end portions from the rear edge or flange 10 of the metal shell; the inner ends of the terminals in this case being fixed to the switch base and electrically connected to their respective switch contacts by rivets 38. To hold the terminals against rotation about their fastening rivets, each terminal has a tail portion 39 received in a hole in the switch base.

Proper spacing of the control from the printed circuit panel is effected in this embodiment of the invention by shoulders 40 on the terminals positioned to engage the panel along with the edge of the terminal support 17 of the variable resistor and thus hold the control with its shaft in its desired relationship to the panel.

From the foregoing description taken in connection with the accompanying drawings, it will be readily apparent to those skilled in this art that this invention provides a combined variable resistor and electric switch especially adapted for use with printed circuitry, and that its adaptation to this new technique involves no departure from well established and accepted design principles.

What I claim as my invention is:

1. A switch device of the type used in radio and television circuits wherein the switch is housed in a casing comprising a substantially cylindrical metal shell and a flat wall of insulating material joined to and closing one end of the shell, said wall providing a base for the switch, and the switch further having stationary contacts on said base, characterized by: terminals for the switch, each having a body portion and an outer end portion offset from one another and connected by an intermediate step portion; a plate of insulating material overlying the exterior of the switch base and the adjacent marginal edge of the metal shell with a part of the plate projecting a substantial distance outwardly beyond one side of the shell and providing a locating edge engageable with the surface of a panel to thereby space the entire device a definite distance from the panel, said plate having holes in its portion which projects outwardly beyond the side of the shell; the terminals being mounted on said plate with their intermediate step portions received in said holes and with their body portions overlying the exterior of the plate and their outer end portions projecting beyond said locating edge of the plate; and electrically conductive means passing through the switch base and the overlying insulating plate and mechanically and electrically connecting each switch contact with the body portion of its respective terminal.

2. The structure set forth in claim 1 further characterized by the fact that the part of the insulating plate which projects beyond the side of the metal shell terminates in a straight edge of a length at least as great as the diameter of the metal shell; and by the fact that the extremities of the end portions of the terminals are all spaced substantially the same distance outwardly from said straight edge.

3. The structure set forth in claim 2 further characterized by the provision of variable resistor coupled to the switch, said switch and variable resistor having a common control shaft normal to the base of the switch, and said variable resistor having a plurality of terminals extending laterally therefrom in the same general direction as the terminals of the switch, and beyond a plane parallel to the axis of the control shaft and containing said locating edge of the insulating plate.

4. A terminal assembly for an electrical component of the type employed in radio and television circuits, comprising: a plate of insulating material having a row of holes near one edge thereof and other holes spaced farther from said edge of the plate; a plurality of terminals, each having a main body portion and an outer end portion; and means securing the terminals to the plate with their body portions overlying one side of the plate and with the body portion of each terminal extending from one of said row of holes to one of the holes remote from said edge of the plate, and with the end portions of the terminals projecting beyond said edge of the plate, said securing means comprising a part integral with each terminal and overlying the side of the plate opposite that at which the body portions of the terminals are located, and a portion joining said part with the remainder of the terminal and passing through one of the holes of said row of holes, and conductor means electrically and mechanically secured to the body portion of the terminal and passing through one of said holes remote from said designated edge of the plate, said conductor means providing for connection of the terminal with a part of the component.

5. A switch of the type used in radio and television circuits wherein the switch mechanism is housed in a casing comprising a substantially cylindrical metal shell and a flat wall of insulating material joined to and closing one end of the shell, said wall providing a base for the switch and the switch further having stationary contacts on said base inside the casing, characterized by: terminals for the switch, each having a body portion; a plate of insulating material overlying the exterior of the switch base and the adjacent marginal edge of the metal shell with a part of the plate projecting a substantial distance outwardly beyond one side of the shell, said plate having holes in its portion which projects outwardly beyond the side of the shell, said holes being close to the edge of the plate farthest from the shell; the terminals being mounted on said plate with their body portions overlying the exterior of the plate, their outer end portions at the other side of the plate and the intervening portions of the terminals received in said holes in the plate, the outer end portions of the terminals projecting beyond said edge of the plate; and electrically conductive means passing through the switch base and the overlying insulating plate and mechanically and electrically connecting each switch contact with the body portion of its respective terminal.

6. In a combined control having variable resistor and switch components arranged in tandem and operable by a common rotatable control shaft: housing means enclosing said components and including a front end wall of insulating material providing a base for the variable resistor and having the control shaft passing therethrough, a rear end wall of insulating material providing a base for the switch, and a cylindrical metal side wall having an inturned flange thereon overlying the rear face of the marginal portion of said rear end wall; terminals for the variable resistor fixed to the front end wall and projecting laterally in generally the same direction beyond the side of the housing means and terminating in a common plane parallel to a plane containing the control shaft axis; a plate of insulating material flatwise overlying said rear end wall and the inturned flange on the side wall; the switch having contacts on the inner face of said rear end wall; switch terminals on said plate having portions thereof on the rear face of the plate in line with the switch contacts and having end portions projecting beyond the side of the housing means in the same direction and to the same extent as the resistor terminals; electrically conductive means passing through the plate and said rear end wall, connecting the switch terminals with their respective switch contacts, and securing the plate in place on the housing means with the inturned side wall flange clamped between the plate and said rear end wall; and means including said insulating plate providing front and rear supporting means for the control fixed with respect to the housing means, and adapted to support the control on a panel with all of its terminals passing through holes in the panel and with the control shaft spaced a definite distance from the panel and substantially parallel thereto, said front and rear supporting means projecting laterally beyond the side of the housing means in the same direction as said terminals and having locating surfaces on outer portions thereof facing away from the housing means and lying in a plane parallel to said plane of the terminal extremities but spaced from the control shaft axis a distance slightly less than said plane of the terminal extremities.

References Cited in the file of this patent

UNITED STATES PATENTS

| | | |
|---|---|---|
| 1,926,196 | Da Costa | Sept. 12, 1933 |
| 2,172,397 | Meuer | Sept. 12, 1939 |

FOREIGN PATENTS

| | | |
|---|---|---|
| 780,250 | France | Apr. 20, 1935 |